(12) United States Patent
Glenn et al.

(10) Patent No.: US 6,407,381 B1
(45) Date of Patent: Jun. 18, 2002

(54) WAFER SCALE IMAGE SENSOR PACKAGE

(75) Inventors: Thomas P. Glenn, Gilbert; Steven Webster, Chandler, both of AZ (US); Tony Arellano, Metro Manila (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/610,314

(22) Filed: Jul. 5, 2000

(51) Int. Cl.[7] ............................................ H01L 31/0203
(52) U.S. Cl. ..................... 250/239; 250/208.1; 257/433; 257/434
(58) Field of Search ........................... 250/208.1, 214.1, 250/239; 257/433, 434

(56) References Cited

U.S. PATENT DOCUMENTS

| | | | | |
|---|---|---|---|---|
| 5,051,802 A | * | 9/1991 | Prost et al. .................. | 257/434 |
| 5,122,861 A | * | 6/1992 | Tamura et al. ............... | 257/434 |
| 5,733,382 A | * | 3/1998 | Hanoka ........................ | 136/251 |
| 5,753,857 A | * | 5/1998 | Choi ............................ | 174/52.4 |
| 5,818,035 A | * | 10/1998 | Krivanek et al. ........... | 250/208.1 |
| 5,821,532 A | | 10/1998 | Beaman et al. .............. | 250/239 |
| 5,867,368 A | | 2/1999 | Glenn .......................... | 361/783 |
| 5,986,317 A | * | 11/1999 | Wiese .......................... | 257/433 |
| 6,130,448 A | * | 10/2000 | Bauer et al. ................. | 257/222 |
| 6,172,361 B1 | * | 1/2001 | Holberg et al. ............. | 250/239 |
| 6,184,514 B1 | * | 2/2001 | Rezende et al. ........... | 250/208.1 |
| 6,266,197 B1 | * | 7/2001 | Glenn et al. ................ | 359/819 |

* cited by examiner

Primary Examiner—Robert H. Kim
Assistant Examiner—Allen C. Ho
(74) Attorney, Agent, or Firm—Gunnison, McKay & Hodgson, L.L.P.; Serge J. Hodgson

(57) ABSTRACT

An image sensor package includes an image sensor having bond pads and an active area on an upper surface of the image sensor. The image sensor package further includes a window support on the upper surface of the image sensor. The window support entirely encloses the upper surface including the active area and the bond pads. A window is in contact with the window support, the window overlying the active area. Generally, the window support and the window entirely enclose, and thus protect, the active area of the image sensor.

18 Claims, 8 Drawing Sheets

WAFER SCALE IMAGE SENSOR PACKAGE

FIELD OF THE INVENTION

The present invention relates generally to the packaging of electronic components. More particularly, the present invention relates to an image sensor package.

BACKGROUND OF THE INVENTION

Image sensors are well known to those of skill in the art. An image sensor included an active area, which was responsive to electromagnetic radiation. To avoid obstructing or distorting the electromagnetic radiation which struck the active area of the image sensor, it was important to avoid contamination, e.g., from dust, of the active area.

Image sensors were fabricated from a silicon wafer. More particularly, a plurality of image sensors were formed in a single silicon wafer. The silicon wafer was singulated, sometimes called cut-up or diced, to separate the image sensors from one another. However, during this wafer singulation, silicon shards were generated. These silicon shards had a tendency to contaminate and scratch the active areas of the image sensors. As a result, image sensors were damaged or destroyed, which undesirably decreased the yield. However, to reduce cost, it is important to have a high yield.

The singulated image sensor was then used to fabricate an image sensor assembly. In this assembly, the image sensor was located within a housing, which supported a window. Radiation passed through the window and struck the active area of the image sensor, which responded to the radiation.

In one prior art assembly, an image sensor was mounted to a printed circuit mother board. After the image sensor was mounted, a housing was mounted around the image sensor and to the printed circuit mother board. This housing provided a hermetic like seal around the image sensor, while at the same time, supported a window above the image sensor.

As the art moves to smaller and lighter weight electronic devices, it becomes increasingly important that the size of the image sensor assembly used within these electronic devices is small. Disadvantageously, the conventional image sensor assembly described above required a housing to support the window and to hermetically seal the image sensor. However, this housing was relatively bulky and extended upwards from the printed circuit mother board a significant distance, e.g., 0.100 inches (2.54 mm) to 0.120 inches (3.05 mm) or more. As a result, the image sensor assembly was relatively large.

In the event that moisture was trapped inside of the housing, defective operation or failure of the image sensor assembly was observed. More particularly, the moisture had a tendency to condense within the housing and on the interior surface of the window. Even if the housing later dried out, a stain was left on the window. In either event, electromagnetic radiation passing through the window was distorted or obstructed by either moisture condensation or stain, which resulted in defective operation or failure of the image sensor assembly.

For this reason, an important characteristic was the temperature at which condensation formed within the housing of image sensor assembly, i.e., the dew point of the image sensor assembly. In particular, it was important to have a low dew point to insure satisfactory performance of the image sensor assembly over a broad range of temperatures.

SUMMARY OF THE INVENTION

In accordance with the present invention, an image sensor package includes an image sensor having a bond pad and an active area, the bond pad and the active area being on an upper, e.g., first, surface of the image sensor. The image sensor package further includes a window support on the upper surface of the image sensor. The window support entirely encloses the upper surface including the active area and the bond pad. A window is in contact with the window support, the window overlying the active area. Generally, the window support and the window entirely enclose, and thus protect, the active area of the image sensor.

During use, radiation is directed at the image sensor package. This radiation passes through the window, passes through the window support, and strikes the active area of the image sensor, which responds to the radiation. The window and the window support are transparent to the radiation.

In one embodiment, the refractive index of the window support is similar to the refractive index of the window. In this manner, the sensitivity of the image sensor package is improved compared to the prior art.

Recall that in the prior art, a housing was mounted around the image sensor and to the printed circuit mother board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected. Since the electromagnetic radiation had to pass from air, through the window, and back through air to reach the active area of the image sensor in the prior art, a significant percentage of the electromagnetic radiation was reflected. This resulted in an overall loss of sensitivity of prior art image sensor assemblies.

In contrast, the window and the window support of the image sensor package in accordance with the present invention have a similar refractive index. Accordingly, the amount of reflected radiation is reduced compared to the prior art. This improves the sensitivity of the image sensor package compared to prior art image sensor assemblies.

Further, instead of having air between the window and the active area of the image sensor as in the prior art, the window support completely fills the region between the window and the active area. Advantageously, by eliminating the prior art cavity between the active area and the window, the possibility of moisture condensation within the cavity is also eliminated. Accordingly, the image sensor package does not have a dew point.

In contrast, prior art image sensor assemblies had a dew point, i.e., a temperature at which condensation formed within the housing, which enclosed the image sensor and supported the window. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since the image sensor package in accordance with the present invention does not have a dew point, the image sensor package operates satisfactorily over a broader range of temperatures and, more particularly, at lower temperatures than image sensor assemblies of the prior art. Further, since the image sensor package is formed without a cavity, there is no possibility that moisture will leak into the image sensor package. Accordingly, the reliability of the image sensor package is greater than that of the prior art.

Further, the housing of a prior art image sensor assembly was typically formed of ceramic, which was relatively expensive. Advantageously, the image sensor package in accordance with present invention eliminates the need for a housing of the prior art. Accordingly, the image sensor package is significantly less expensive to manufacture than an image sensor assembly of the prior art.

Further, since the window is attached directly to the image sensor by the window support, the image sensor package can be made relatively thin compared to a prior art image sensor assembly. To illustrate, a 0.039 inch (1.0 mm) or less thickness for the image sensor package is easily achievable.

In contrast, the prior art image sensor housing was relatively bulky and extended upwards from the printed circuit mother board a significant distance, e.g., 0.100 inches (2.54 mm) to 0.120 inches (3.05 mm) or more. Since the image sensor package in accordance with the present invention can be made relatively thin, the image sensor package is well suited for use with miniature lightweight electronic devices, which require thin and lightweight image sensor assemblies.

In an alternative embodiment, a structure comprises an image sensor substrate having a plurality of image sensors integrally connected together. The plurality of image sensors includes a first image sensor having a first bond pad and an active area.

The structure further comprises a window support layer on an upper, e.g., first, surface of the image sensor substrate. The window support layer covers the first bond pad and the active area of the first image sensor. A first window is in contact with the window support layer, the window support layer supporting the first window above the active area of the first image sensor.

Also in accordance with the present invention, a method of forming an image sensor package includes forming a window support layer on an upper, e.g., first, surface of an image sensor substrate such as a wafer. The image sensor substrate includes a first image sensor having an active area covered by the window support layer. An interior, e.g., first, surface of a window sheet is pressed into the window support layer such that a first window of the window sheet is above the active area of the first image sensor.

In one embodiment, the interior surface o the window sheet is pressed into the window support layer while the window support layer is wet. For example, the window support layer is a bonding material, e.g., an epoxy. The window support layer is then setup, e.g., cured, gelled or made tacky.

Of importance, before the window sheet is mounted to the window support layer, a series of shallow cuts are made in the interior surface of the window sheet to define and delineate windows of the window sheet. The shallow cuts in combination with the window support layer define cavities above bond pads of image sensors of the image sensor substrate.

After being mounted to the window support layer, the window sheet is cut with a sawblade from an exterior, e.g., second, surface to singulate the windows from one another. The window sheet is cut from the exterior surface directly opposite of the cavities above the bond pads. The depth to which the sawblade cuts below the exterior surface is set to be sufficiently deep to insure that the sawblade cuts all the way through the window sheet, yet is set to be sufficiently shallow to insure that the sawblade does not damage the bond pads. Advantageously, the cavities accommodate tolerance during this cutting of the window sheet.

The image sensor substrate is then singulated to form a plurality of image sensor packages. Of importance, the active areas of the image sensors are protected by the windows during singulation. More particularly, the windows protect the active areas from contamination and scratching during singulation, e.g., from silicon shards. As a result, damage or destruction of the image sensors is avoided. Accordingly, yield is increased and package cost is reduced compared to the prior art.

Further, the windows protect the active areas during subsequent processing of the image sensor package, e.g., during subsequent wire bonding and/or encapsulation and/or molding. More particularly, the windows protect the active areas from dust and contamination. Accordingly, after attachment of the windows to the image sensors, the image sensor packages can be stored or further packaged in any facility with or without a cleanroom.

Recall that in the prior art, the housing, which hermetically sealed the image sensor, was mounted directly to the printed circuit mother board. Thus, to avoid damage or destruction of the image sensor, the image sensor had to be carefully stored and packaged in a cleanroom. Since the prior art requirement of carefully storing and packaging the image sensor in a cleanroom is eliminated, the cost associated with the image sensor package is reduced compared to the prior art.

Further, by forming a plurality of image sensor packages simultaneously, several advantages are realized. One advantage is that it is less labor intensive to handle and process a plurality of image sensor packages simultaneously rather than to handle and process each image sensor package on an individual basis. Another advantage is that usage of materials is more efficient when an array of image sensor packages is fabricated. By reducing labor and using less material, the cost associated with each image sensor package is minimized.

In one embodiment, to form an image sensor assembly, the image sensor package is further packaged. Advantageously, since the active area of the image sensor is protected by the window, the image sensor package can be further packaged using any one of a number of packaging techniques. For example, the image sensor package is put into a flip chip, a leadframe, or a wirebonded image sensor assembly.

Further, the window is formed with a locking feature, which mechanically locks the window to the package body of the image sensor assembly. Since the window is mechanically locked to the package body, the window support can be formed with less structural integrity and adhesion to the window than otherwise would be required if the window support was entirely responsible for supporting the window.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
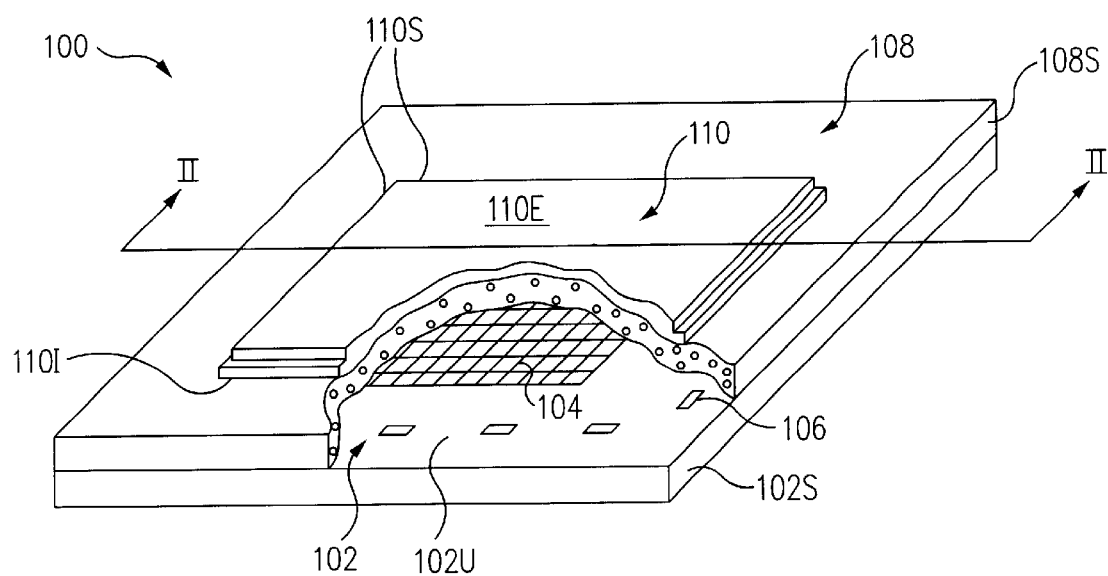
FIG. 1 is a perspective view, partially cutaway, of an image sensor package in accordance with the present invention.

In accordance with the present invention, an image sensor package 100 (FIGS. 1 and 2) includes an image sensor 102 having bond pads 106 and an active area 104 on an upper surface 102U of image sensor 102. Image sensor package 100 further includes a window support 108 on upper surface 102U of image sensor 102. Window support 108 entirely encloses upper surface 102U including active area 104 and bond pads 106. A window 110 is in contact with window support 108, window 110 overlying active area 104. Generally, window support 108 and window 110 entirely enclose, and thus protect, active area 104 of image sensor 102.

During use, radiation is directed at image sensor package 100. This radiation passes through window 110, passes through window support 108, and strikes active area 104 of image sensor 102, which responds to the radiation. Window 110 and window support 108 are transparent to the radiation.

In one embodiment, the refractive index of window support 108 is similar to the refractive index of window 110. In this manner, the sensitivity of image sensor package 100 is improved compared to the prior art.

Further, instead of having air between the window and the active area of the image sensor as in the prior art, window support 108 completely fills the region between window 110 and active area 104. Advantageously, by eliminating the prior art cavity between the active area and the window, the possibility of moisture condensation within the cavity is also eliminated. Accordingly, image sensor package 100 does not have a dew point.

Further, the housing of a prior art image sensor assembly was typically formed of ceramic, which was relatively expensive. Advantageously, image sensor package 100 in accordance with present invention eliminates the need for a housing of the prior art. Accordingly, image sensor package 100 is significantly less expensive to manufacture than an image sensor assembly of the prior art.

Further, since window 110 is attached directly to image sensor 102 by window support 108, image sensor package 100 can be made relatively thin compared to a prior art image sensor assembly.

Also in accordance with the present invention, a method of forming an image sensor package includes forming a window support layer 650 (FIG. 6) on an upper surface 602U of an image sensor substrate 602 such as a wafer. Image sensor substrate 602 includes image sensors 102 having active areas 104 covered by window support layer 650.

Figure 5:
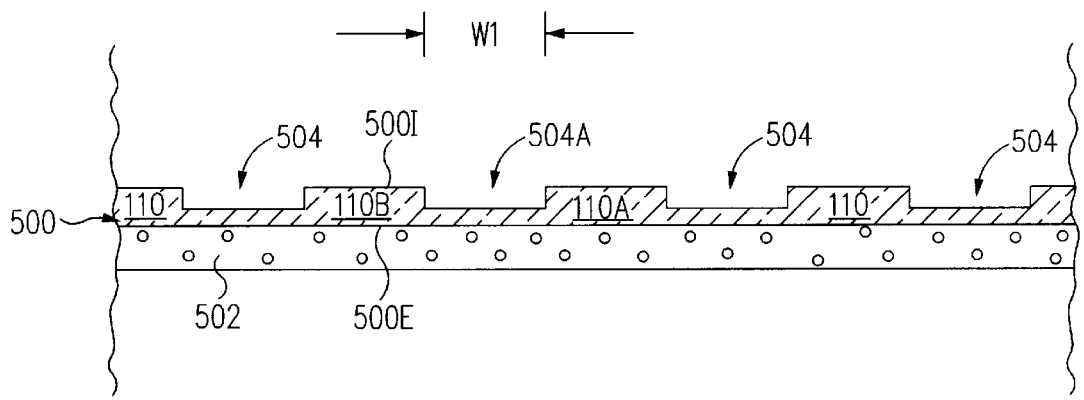
FIG. 5 is a cross-sectional view of a single window sheet during the formation of a plurality of windows in accordance with the present invention.
Figure 7:
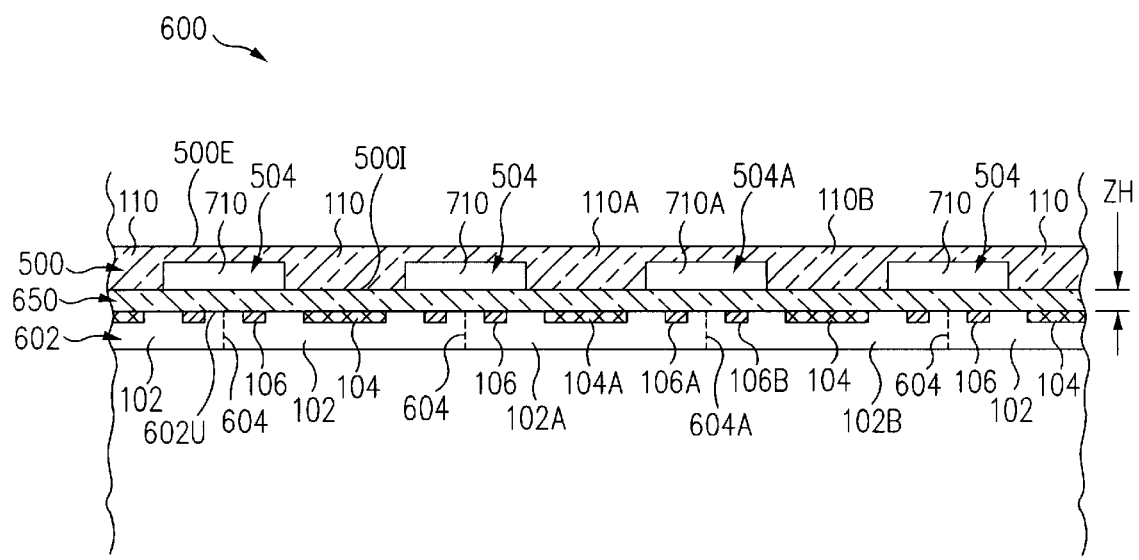
FIG. 7 is a cross-sectional view of the structure of FIG. 6 at a further stage of fabrication.

Referring now to FIGS. 5 and 7 together, an interior surface 500I of a window sheet 500 is pressed into window support layer 650 such that windows 110 of window sheet 500 are above active areas 104 of image sensors 102.

In one embodiment, interior surface 500I of window sheet 500 is pressed into window support layer 650 while window support layer 650 is wet. For example, window support layer 650 is a bonding material, e.g., an epoxy. Window support layer 650 is then setup, e.g., cured, gelled or made tacky.

Of importance, before window sheet 500 is mounted to window support layer 650, a series of shallow cuts 504 (FIG. 5) are made in interior surface 500I of window sheet 500 to define and delineate windows 110 of window sheet 500. Shallow cuts 504 in combination with window support layer 650 define cavities 710 (FIG. 7) above bond pads 106 of image sensors 102 of image sensor substrate 602.

Window sheet 500 is cut with a sawblade 802A (FIG. 8B) from an exterior surface 500E of window sheet 500 to singulate windows 110 from one another. Window sheet 500 is cut from exterior surface 500E directly opposite of cavities 710 above bond pads 106. The depth to which sawblade 802A cuts below exterior surface 500E is set to be sufficiently deep to insure that sawblade 802A cuts all the way through window sheet 500, yet is set to be sufficiently shallow to insure that sawblade 802A does not damage bond pads 106. Advantageously, cavities 710 accommodate, tolerance during this cutting of window sheet 500.

Figure 2:
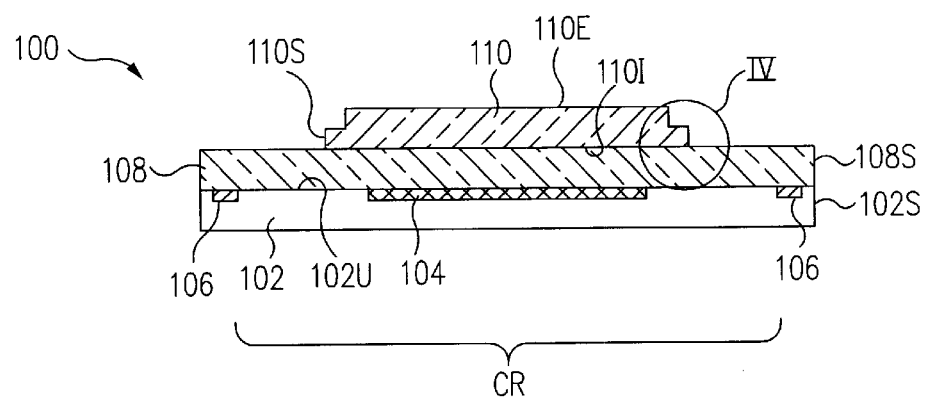
FIG. 2 is a cross-sectional view of the image sensor package along the line II—II of FIG. 1.

Image sensor substrate 602 is then singulated to form a plurality of image sensor packages 100 (FIGS. 1 and 2). Of importance, active areas 104 of image sensors 102 are protected by windows 110 during singulation. More particularly, windows 110 protect active areas 104 from contamination and scratching during singulation, e.g., from silicon shards. As a result, damage or destruction of image sensors 102 is avoided. Accordingly, yield is increased and package cost is reduced compared to the prior art.

Further, windows 110 protect active areas 104 during subsequent processing of image sensor package 100, e.g., during subsequent wire bonding and/or encapsulation and/or molding. More particularly, windows 110 protect active areas 104 from dust and contamination. Accordingly, after attachment of windows 110 to image sensors 102, image sensor packages 100 can be stored or further packaged in any facility with or without a cleanroom.

Figure 12:
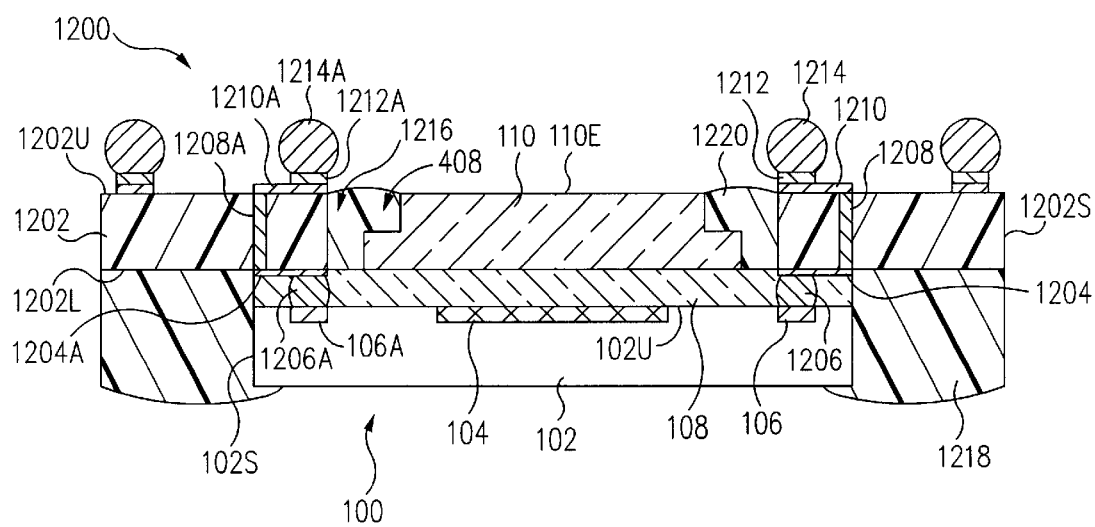
FIG. 12 is a cross-sectional view of a flip chip image sensor assembly in accordance with one embodiment of the present invention.
Figure 13:
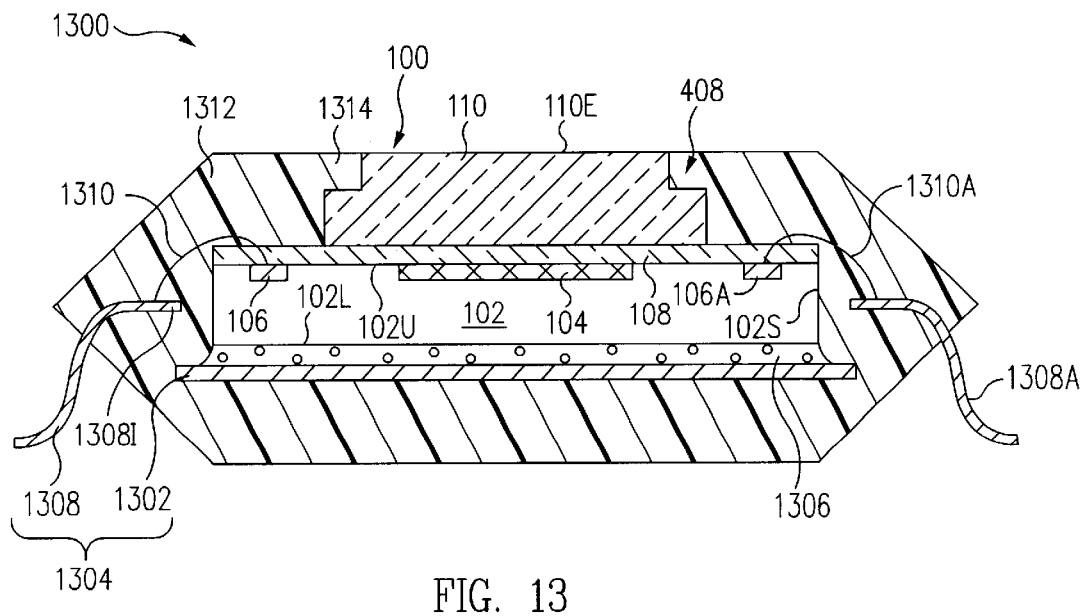
FIG. 13 is a cross-sectional view of a leadframe image sensor assembly in accordance with an alternative embodiment of the present invention.

In one embodiment, to form an image sensor assembly, image sensor package 100 is further packaged. Advantageously, since active area 104 of image sensor 102 is protected by window 110, image sensor package 100 can be further packaged using any one of a number of conventional packaging techniques. For example, image sensor package 100 is put into a flip chip image sensor assembly as shown in FIG. 12, a leadframe image sensor assembly as shown in FIG. 13, or a wirebonded image sensor assembly as shown FIG. 14.

More particularly, FIG. 1 is a perspective view, partially cutaway, of an image sensor package 100 (hereinafter package 100) in accordance with the present invention. FIG. 2 is a cross-sectional view of package 100 along the line II—II of FIG. 1.

Referring to FIGS. 1 and 2 together, package 100 includes an image sensor 102, sometimes called a sensor device. Image sensor 102 includes an active area 104, sometimes called an image array. Active area 104 is on an upper, e.g., first, surface 102U of image sensor 102. Generally, active area 104 is responsive to radiation, e.g., electromagnetic radiation, as is well known to those of skill in the art. For example, active area 104 is responsive to infrared radiation, ultraviolet light, and/or visible light. Illustratively, image sensor 102 is a CMOS image sensor device, a charge coupled device (CCD), a pyroelectric ceramic on CMOS device, or an erasable programmable read-only memory device (EPROM) although other image sensors are used in other embodiments.

Image sensor 102 further includes a plurality of bond pads 106 on upper surface 102U of image sensor 102. Bond pads 106 are connected to the internal circuitry of image sensor 102. Active area 10 is inwards of bond pads 106.

Formed on upper surface 102U is a window support 108. More particularly, window support 108 entirely contacts and entirely encloses upper surface 102U including active area 104 and bond pads 106. Sides 108S of window support 108 are coplanar with sides 102S of image sensor 102.

Generally, window support 108 is transparent to the radiation of interest, e.g., to the radiation to which active area 104 of image sensor 102 is responsive, as those of skill in the art will understand. Illustratively, window support 108 is an epoxy which has been setup, e.g., cured, gelled or made tacky. In one particular embodiment, window support 108 is mastersil product grade 151 silicone epoxy available from Master Bond Inc. of Hackensack, N.J.

Window support 108 is in contact with and secures a window 110 to upper surface 102U of image sensor 102. Window 110 includes an interior, e.g., first, surface 110I and an exterior, e.g., second, surface 110E opposite interior surface 110I. Interior surface 110I is secured to window support 108 and exterior surface 110E is exposed to the ambient environment. Window 110 further includes sides 110S, which extend between exterior surface 110E and interior surface 110I.

In this embodiment, window support 108 contacts interior surface 110I only, i.e., does not contact sides 110S. Further, window 110 overlies a central region CR of upper surface 102U inwards of bond pads 106 and does not overlie bond pads 106. Bond pads 106 are along the entire periphery of upper surface 102U. Active area 104 is within central region CR and window 110 overlies active area 104.

Window 110 is parallel to upper surface 102U of image sensor 102. More particularly, a plane defined by interior surface 110I (or exterior surface 110E) is parallel to a plane defined by upper surface 102U of image sensor 102.

Window 110 is transparent to the radiation of interest, e.g., to the radiation to which active area 104 of image sensor 102 is responsive, as those of skill in the art will understand. In one particular embodiment, window 110 is optically transparent borosilicate glass.

Generally, the transmittance of window support 108 and window 110 is sufficient to allow the necessary minimum amount of radiation needed for the proper operation of image sensor 102 to pass through window support 108 and window 110.

During use, radiation is directed at package 100. This radiation passes through window 110, through window support 108 and strikes active area 104, which responds to the radiation as is well known to those of skill in the art. However, in an alternative embodiment, active area 104 of image sensor 102 transmits radiation such as electromagnetic radiation. For example, image sensor 102 is a light emitting diode (LED) micro-display. In accordance with this embodiment, radiation transmitted by active area 104 passes through window support 108, through window 110, and emanates from package 100. For simplicity, in the above and following discussions, active area 104 as a receiver of radiation is set forth. However, in light of this disclosure, those of skill in the art will recognize that generally active area 104 is a receiver of radiation, a transmitter of radiation, or a transceiver, i.e., a transmitter and a receives, of radiation.

In one embodiment, the refractive index of window support 108 is similar to the refractive index of window 110. In this manner, the sensitivity of package 100 is improved compared to the prior art.

Recall that in the prior art, a housing was mounted around the image sensor and to the printed circuit mother board. This housing supported a window above the image sensor. However, located between the window and the image sensor was air. Disadvantageously, air has a relatively low refractive index compared to the window.

As those skilled in the art understand, as visible light or other electromagnetic radiation passe from a material having a high refractive index to a material having a low refractive index and vice versa, a significant percentage of the electromagnetic radiation is reflected. To illustrate, for a window having a refractive index of 1.52, at each window/air interface, approximately 4 percent of the electromagnetic radiation is reflected. Since the electromagnetic radiation had to pass from air, through the window, and back through air to reach the active area of the image sensor in the prior art, a significant percentage of the electromagnetic radiation was reflected. This resulted in an overall loss of sensitivity of prior art image sensor assemblies.

In contrast, window 110 and window support 108 of package 100 have a similar refractive index. Illustratively, the difference between the refractive index of window 110 and the refractive index or window support 108 is such that the amount of radiation reflected at the interface of window 110 and window support 108 is one percent or less. As an example, window 110 has a refractive index of 1.52 and window support 108 has a refractive index of 1.40. Accordingly, the amount of reflected radiation is reduced compared to the prior art. This improves the sensitivity of package 100 compared to prior at image sensor assemblies. In one embodiment, package 100 is 13% more sensitive to electromagnetic radiation than prior art image sensor assemblies.

Further, instead of having air between the window and the active area of the image sensor as in the prior art, window support 108 completely fills the region between window 110 and active area 104. In other words, package 100 is a cavityless package, i.e., package 100 does not have a cavity between window 110 and active area 104. Advantageously, by eliminating the prior art cavity between the active area and the window, the possibility of moisture condensation within the cavity is also eliminated. Accordingly, package 100 has no dew point.

In contrast, prior art image sensor assemblies had a dew point, i.e., a temperature at which condensation formed within the housing which enclosed the image sensor and supported the window. In general, moisture had a tendency to condense within the housing and on the interior surface of the window. To avoid this condensation, it was important to avoid subjecting the image sensor assembly to extreme low temperatures. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since package 100 does not have a dew point, package 100 operates satisfactorily over a broader range of temperatures and, more particularly, at lower temperatures than image sensor assemblies of the prior art. Further, since package 100 is a cavityless package, there is no possibility that moisture will leak into package 100. Accordingly, the reliability of package 100 is greater than that of the prior art.

Further, the housing of a prior art imager sensor assembly was typically formed of ceramic, which was relatively expensive. Advantageously, package 100 in accordance with present invention eliminates the need for a housing of the prior art. Accordingly, package 100 is significantly less expensive to manufacture than image sensor assemblies of the prior art.

Further, since window 110 is attached directly to image sensor 102 by window support 108, package 100 can be made relatively thin compared to a prior art image sensor assembly. To illustrate, a 0.039 inch (1.0 mm) or less thickness for package 100 is easily achievable.

In contrast, the prior art image sensor housing was relatively bulky and extended upwards from the printed circuit mother board a significant distance, e.g., 0.100 inches (2.54 mm) to 0.120 inches (3.05 mm) or more. Since package 100 can be made relatively thin, package 100 is well suited for use with miniature lightweight electronic devices, which require thin and lightweight image sensor assemblies.

Referring still to FIGS. 1 and 2, window support 108 entirely encloses upper surface 102U including bond pads 106, i.e., window support 108 covers bond pads 106. As discussed in greater detail below, during subsequent packaging of package 100, bond wire or other electrically conductive structures are electrically connected to bond pads 106. To facilitate formation of electrical connections with bond pads 106, in some applications, it may be desirable to have bond pads 106 exposed and not covered by window support 108.

Figure 3:
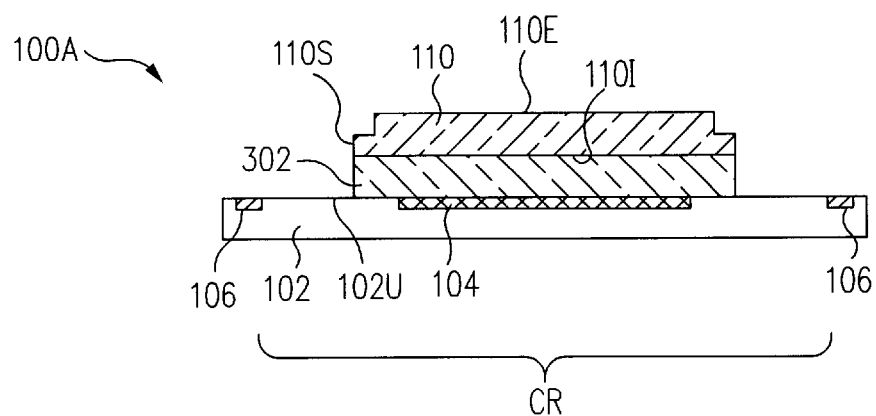
FIG. 3 is a cross-sectional view of an image sensor package having exposed bond pads in accordance with an alternative embodiment of the present invention.

FIG. 3 is a cross-sectional view of an image sensor package 100A (hereinafter package 100A) having exposed bond pads 106 in accordance with an alternative embodiment of the present invention. Package 100A of FIG. 3 is similar to package 100 of FIGS. 1 and 2 and only the significant differences are discussed below.

Referring now to FIG. 3, package 100A includes a window support 302. Window support 302 is formed on central region CR of upper surface 102U of image sensor 102. Window support 302 contacts and entirely encloses active area 104 yet does not extend over bond pads 106. Since bond pads 106 are exposed, bond wires or other electrically conductive structures are readily connected to bond pads 106.

Generally, window support 302 is transparent to the radiation of interest. In one embodiment, window support 302 is formed of the same material as window support 108 (FIGS. 1, 2) described above.

Figure 4:
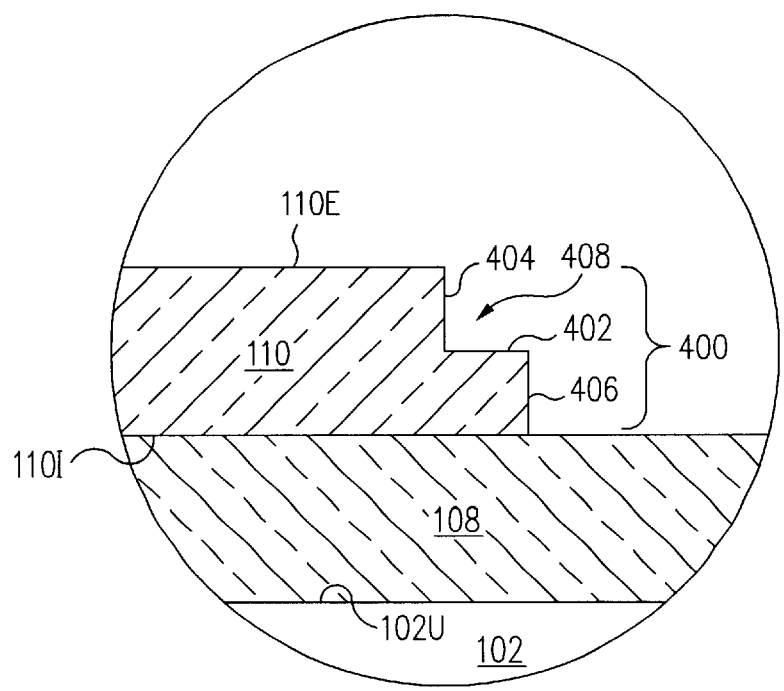
FIG. 4 is an enlarged cross-sectional view of the region IV of the image sensor package of FIG. 2.

FIG. 4 is an enlarged cross-sectional view of the region IV of package 100 of FIG. 2. Referring now to FIG. 4, window 110 includes a locking feature 400 along the periphery of window 110. Generally, locking feature 400 mechanically locks window 110 to the package body, e.g., to plastic or liquid encapsulant, as discussed in greater detail below in reference to FIGS. 12, 13 and 14.

Locking feature 400 is formed along sides 110S (FIGS. 1, 2) of window 110. In this embodiment, locking feature 400 is shaped as a ledge, sometimes called a step, which extends around the periphery of window 110. More particularly, locking feature 400 includes a rectangular ring-like shelf 402, e.g., a third surface, which extends around exterior surface 110E. Shelf 402 is located on a plane parallel to, and located between, a plane defined by exterior surface 110E and a plane defined by interior surface 100I.

Step sides 404 extend between exterior surface 110E and shelf 402 and step sides 406 extend between shelf 402 and interior surface 110I. In this embodiment, step sides 404, 406, are perpendicular to planes defined by exterior surface 110E, interior surface 110I, and shelf 402.

Of importance, shelf 402 and step sides 494 define a pocket 408. As discussed in greater detail below with reference to FIGS. 12, 13 and 14, the package body extends into and fills pocket 408 thus mechanically locking window 110 into place. Although locking feature 400 is illustrated as a ledge in FIG. 4, in light of this disclosure, those of skill in the art will understand that other locking features can be used. Further, in one embodiment, window 110 does not include a locking feature.

In one embodiment, window 110 is fabricated simultaneously with a plurality of windows 110 from a single window sheet. FIG. 5 is a cross-sectional view of a single window sheet 500 during the formation of a plurality of windows 110 including a first window 110A and a second window 110B. Illustratively, window sheet 500 is a sheet of borosilicate glass.

Initially, window sheet 500 is attached to a support 502 such as a sticky tape used in wafer dicing as is well known to those of skill in the art. A series of shallow cuts 504 are made in an interior, e.g., first, surface 500I of window sheet 500, for example, with a saw blade, to define and delineate windows 110. For example, a first shallow cut 504A of the plurality of shallow cuts 504 defines and delineates first window 110A from second window 110B. An exterior, e.g., second, surface 500E of window sheet 500 is attached to support 502.

Of importance, shallow cut 504A only score window sheet 500 and does not cut through window sheet 500. Illustratively, shallow cut 504A is a rectangular groove 0.015 inches (0.38 mm) wide, which cuts halfway through window sheet 500. More generally, shallow cut 504A has a width W1. The other shallow cuts 504 are similar to shallow cut 504A. Further, the other windows 110 are similarly defined and delineated from adjacent windows 110 by corresponding shallow cuts 504. Generally, windows 110 are formed in an array, e.g., a 2×2, 3×3, . . . or nxm array.

Figure 6:
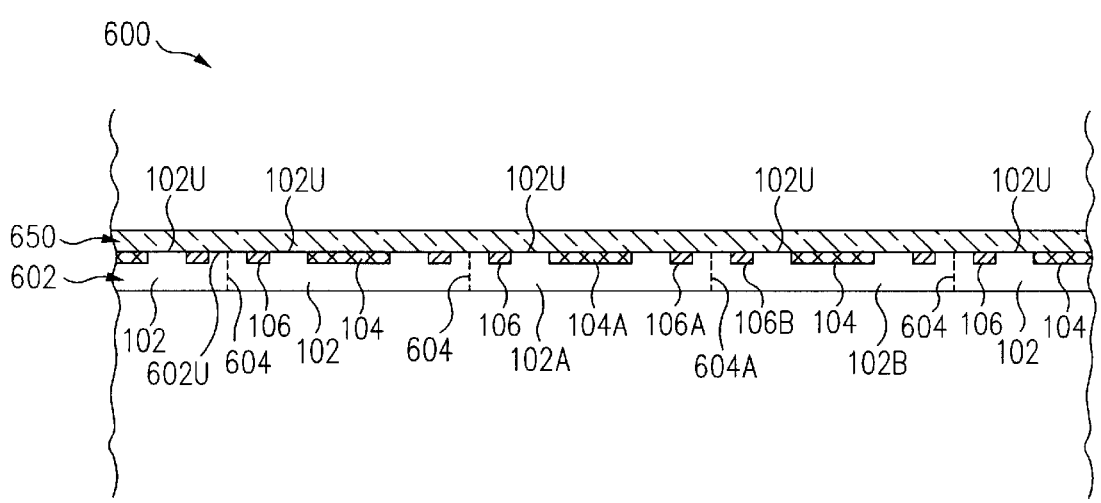
FIG. 6 is a cross-sectional view of a structure during the fabrication of a plurality of image sensor packages in accordance with the present invention.

FIG. 6 is a cross-sectional view of a structure 600 during the fabrication of a plurality of packages 100 (FIGS. 1, 2) in accordance with the present invention. Structure 600 includes an image sensor substrate 602 such as a silicon wafer. Image sensor substrate 602 includes a plurality of image sensors 102 integrally connected together. Image sensors 102 include active areas 104 formed on an upper, e.g., first, surface 602U of image sensor substrate 602. Image sensors 102 further include bond pads 106 on upper surface 602U of image sensor substrate 602. Bond pads 106 are connected to the internal circuitry of image sensors 102.

To illustrate, a first image sensor 102A of the plurality of image sensors 102 includes a first active area 104A of the plurality of active areas 104. Image sensor 102A also includes a first bond pad 106A of the plurality of bond pads 106. The other image sensors 102 include active areas 104 and bond pads 106 in a similar manner.

Image sensors 102 are integrally connected together in an array format. Each of image sensors 102 is delineated by a singulation street 604, which is located between adjacent image sensors 102. For example, a first singulation street 604A of the plurality of singulation streets 604 delineates first image sensor 102A from a second image sensor 102B of the plurality of image sensors 102. The other image sensors 102 are similarly delineated from adjacent image sensors 102 by corresponding singulation streets 604.

A window support layer 650 is formed on an upper, e.g., first, surface 602U of image sensor substrate 602. For example, upper surface 602U is coated with a bonding material, e.g., an epoxy, such as mastersil product grade 151 silicone epoxy available from Master Bond Inc. of Hackensack, N.J. to form window support layer 650. Upper surface 602U is coated with the bonding material using any one of a number of techniques, e.g., a spin coating, syringe dispensing and/or screen printing technique, as those of skill in the art will understand. Generally, it is important that a well-defined, controlled, and repeatable volume of the bonding material is coated on upper surface 602U.

As shown in FIG. 6, window support layer 650 entirely covers and encloses upper surface 602U of image sensor substrate 602. More particularly, window support layer 650 extends over and covers bond pads 106, active areas 104 and upper surfaces 102U of image sensors 102.

FIG. 7 is a cross-sectional view of structure 600 of FIG. 6 at a further stage of fabrication. Referring now to FIGS. 5 and 7 together, window sheet 500 is removed from support 502, inverted and pressed into window support layer 650. Of importance, window sheet 500 is pressed into window support layer 650 while window support layer 650 is wet, i.e., before window support layer 650 is setup.

More particularly, interior surface 500I of window sheet 500 is pressed into and is in contact with window support layer 650. After window sheet 500 is dressed into window support layer 650, window support layer 650 is cured. For example, window support layer 650 is cured with ultraviolet light or heat. Further, instead of being cured, window support layer 650 can be gelled or made tacky. Generally, window support layer 650 is setup, e.g., cured, gelled or made tacky.

As discussed further below in reference to FIGS. 12, 13 and 14, windows 110 are held in place by window supports 108 in combination with the package body. Accordingly, window support layer 650, which ultimately forms window supports 108, can be formed with less structural integrity and adhesion to windows 110 than otherwise would be required if window support 108 were entirely responsible for supporting windows 110.

Of importance, window sheet 500 is aligned with image sensor substrate 602 such that shallow cuts 504 are aligned with corresponding singulation streets 604 and corresponding bond pads 106. Thus, cavities 710 are formed by shallow cuts 504 and window support layer 650. Cavities 710 are located above, i.e., in a first direction from, singulation streets 604 and adjacent bond pads 106.

To illustrate, image sensor 102A includes bond pad 106A. Image sensor 102B includes a second bond pad 106B of the plurality of bond pads 106. Bond pads 106A, 106B are formed directly adjacent to singulation street 604A and are opposite one another relative to singulation street 604A. A first cavity 710A of the plurality of cavities 710 is formed by shallow groove 504A and window support layer 650. Cavity 710A is above singulation street 604A and bond pads 106A, 106B. Further, windows 110 of window sheet 500 are in contact with window support layer 650, which supports windows 110 above corresponding active areas 104. To illustrate, window 110A is in contact with window support layer 650, which supports window 110A above active area 104A.

Cavities 710 are located between window sheet 500 and bond pads 106 and singulation streets 604. Of importance, cavities 710 accommodate tolerance in removal, e.g., sawing, of window sheet 500 above bond pads 106 and singulation streets 604 as discussed in greater detail below with reference to FIGS. 8A, 8B.

Figure 8A:
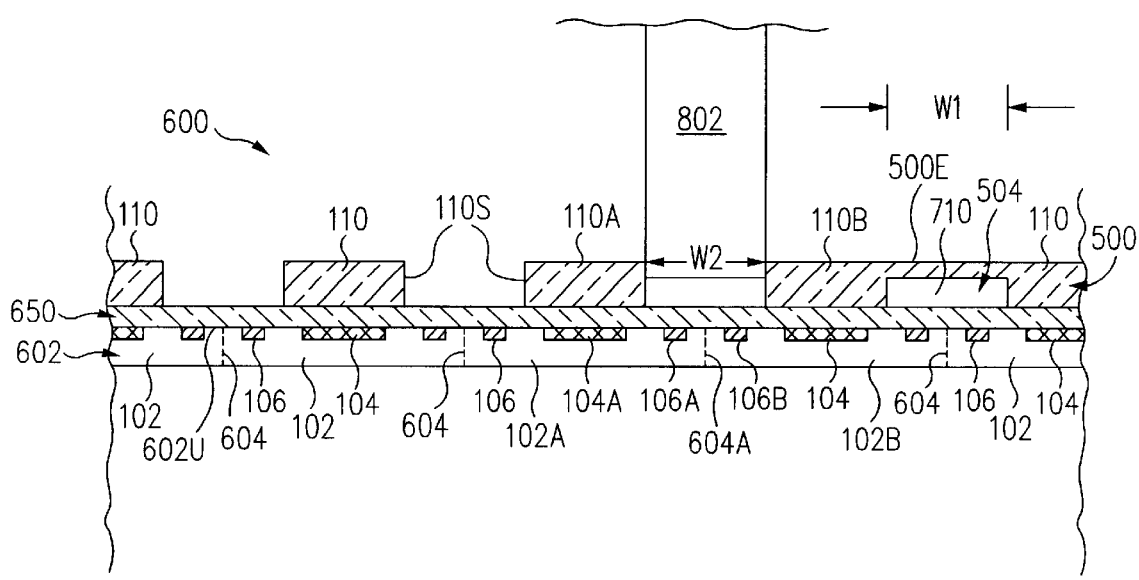
FIG. 8A is a cross-sectional view of the structure of FIG. 7 at a further stage of fabrication in accordance with one embodiment of the present invention.

FIG. 8A is a cross-sectional view of structure 600 of FIG. 7 at a further stage of fabrication in accordance with one embodiment of the present invention. As shown in FIG. 8A, window sheet 500 is cut from exterior surface 500E to singulate windows 110 from one another. Window sheet 500 is cut by a sawblade 802, although in other embodiments, window sheet 500 is cut using a different technique, e.g., by a laser.

Window sheet 500 is cut from exterior surface 500E directly opposite of cavities 710 and above singulation streets 604 and bond pads 106. Window sheet 500 is cut all the way through to cavities 710. The depth to which sawblade 802 cuts below exterior surface 500E is set to be sufficiently deep to insure that sawblade 802 cuts all the way through window sheet 500, yet is set to be sufficiently shallow to insure that sawblade 802 does not damage bond pads 106 and, more generally, image sensor substrate 602. Advantageously, cavities 710 accommodate tolerance during cutting of window sheet 500.

Width W2 of sawblade 802 is approximately the same as width W1 of shallow cuts 504. In this manner, windows 110 are formed to have planar, i.e., flat, sides 110S.

To illustrate, referring to FIG. 8A, sawblade 802 is illustrated as cutting through window sheet 500 from exterior surface 500E between window 110A and window 110B. Sawblade 802 cuts all the way through window sheet 500 to cavity 710A (FIG. 7) above bond pad 106A, bond pad 106B and singulation street 604A thus singulating window 110A from window 110B. Sawblade 802 singulates the other windows 110 in a similar manner.

As set forth above, by having width W2 of sawblade 802 to be approximately equal to width W1 of shallow cuts 504, windows 110 are formed to have planar sides 110S. However, in certain instances, it is desirable to form a locking feature (see locking feature 400 of FIG. 4, for example) along sides 110S.

Figure 8B:
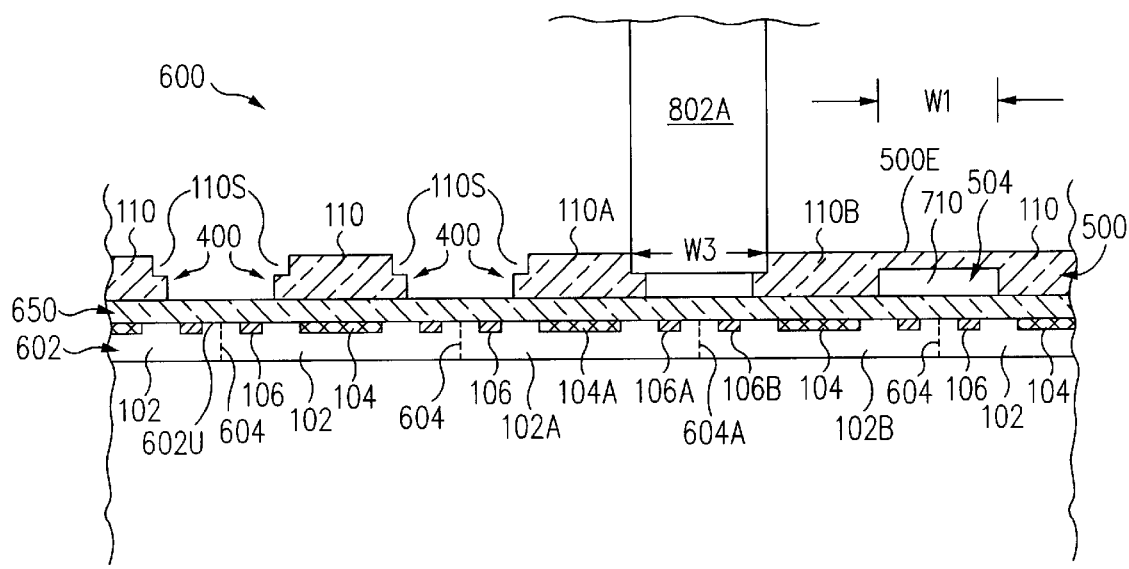
FIG. 8B is a cross-sectional view of the structure of FIG. 7 at a further stage of fabrication in accordance with an alternative embodiment of the present invention.

FIG. 8B is a cross-sectional view of structure 600 of FIG. 7 at a further stage of fabrication in accordance with an alternative embodiment of the present invention. FIG. 8B is substantially similar to FIG. 8A and only the significant differences are discussed below.

Referring now to FIG. 8B, window sheet 500 is cut from exterior surface 500E to singulation windows 110 from one another. Window sheet 500 is cut by a sawblade 802A, although in other embodiments, window sheet 500 is cut using a different technique, e.g., by a laser.

Window sheet 500 is cut from exterior surface 500E directly opposite of cavities 710 and above singulation streets 604 and bond pads 106. Window sheet 500 is cut all the way through to cavities 710.

Width W3 of sawblade 802A is greater than width W1 of shallow cuts 504. In this manner, windows 110 are formed to have locking features 400 as discussed in detail above with reference to FIG. 4.

To illustrate, referring to FIG. 8B, sawblade 802A is illustrated as cutting through window sheet 500 from exterior surface 500E between window 110A and window 110B. Sawblade 802A cuts all the way through window sheet 500 to cavity 710A (FIG. 7) above bond pad 106A, bond pad 106B and singulation street 604A thus singulating window 110A from window 110B. Width W3 of sawblade 802A is greater than width W1 of shallow cuts 504 resulting in the formation of windows 110A, 110B having locking features 400. Sawblade 802A singulates the other windows 110 in a similar manner.

Advantageously, shallow cuts 504 and the cuts made by sawblade 802A in window sheet 500 are desirably rough cuts to enhance the locking ability of locking features 400. Since rough cuts are desirable, shallow cuts 504 and the cuts made by sawblade 802A can be made using a high-speed cutting process.

In contrast, for aesthetic, safety and other reasons, prior art windows for image sensor assemblies were formed with finished cuts, i.e., smooth cuts. In other words, chipped, jagged or damaged window were unacceptable for use in prior art image sensor assemblies and were discarded. Further, to form windows with the finished cuts, a slow-speed cutting process was used. For these reasons, windows 110 in accordance with the present invention are fabricated at a lower cost than windows of prior art image sensor assemblies.

After singulation of windows 110, bond pads 106 and singulation streets 604 are laterally located between adjacent windows 110 and are not covered by windows 110. To illustrate, bond pad 106A, bond pad 106B and singulation street 604A are laterally located between window 110A and window 110B. However,!bond pads 106 and singulation streets 604 remain covered by window support layer 650. In certain instances, it is desirable to selectively remove window support layer 650 above bond pads 106 and singulation streets 604 so that bond pads 106 are exposed.

Figure 9:
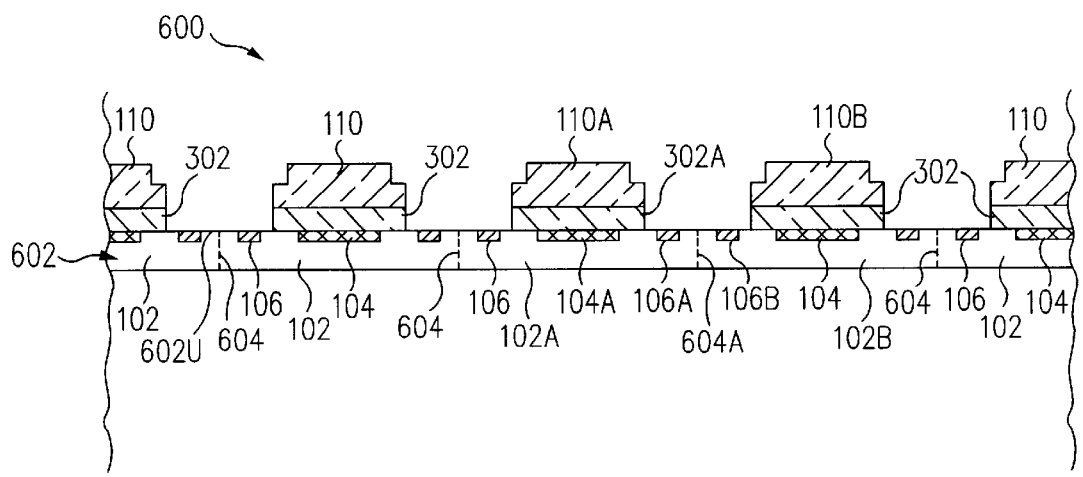
FIG. 9 is a cross-sectional view of the structure of FIG. 8B at a further stage of fabrication.

FIG. 9 is a cross-sectional view of structure 600 of FIG. 8B at a further stage of fabrication. As shown in FIG. 9, window support layer 650 is selectively removed, sometimes called etched, above bond pads 106 and singulation streets 604. Advantageously, windows 110 are used as an etch mask to selectively remove window support layer 650 laterally between windows 110. Window support layer 650 is selectively removed using any one of a number of techniques, e.g., by chemical stripping or plasma etching, using windows 110 as an etch mask.

To illustrate, window support layer 650 is removed laterally between window 110A and window 110B using window 110A and window 110B as an etch mask to expose bond pad 106A, bond pad 106B and singulation street 604A. Window support layer 650 is selectively removed laterally between the other windows 110 in a similar manner.

After being selectively removed, the remaining portions of window support layer 650, i.e., the portions of window support layer 650 between windows 110 and corresponding image sensors 102, form window supports 302. To illustrate, a first window support 302A of the plurality of window supports 302 is between window 110A and image sensor 102A. The other window supports 302 are formed in a similar manner.

Image sensor substrate 602 is singulated along singulation streets 604 to form a plurality of packages 100A (FIG. 3). Alternatively, window support layer 650 is not etched as shown in FIG. 9, e.g., structure 600 of FIG. 8B is singulated along singulation streets 604 to form a plurality of packages 100 (FIGS. 1 and 2). In this case, window support layer 650 forms window supports 108 of packages 100. In either case, singulation is accomplished using any one of a number of conventional singulation techniques, e.g., by laser cutting or mechanical sawing through image sensor substrate 602.

For simplicity, package 100 of FIGS. 1 and 2 is frequently referred to and discussed below. However, it is understood that the discussion and illustrations equally apply to package 100A of FIG. 3.

Of importance, referring again to FIG. 8B active areas 104 of image sensors 102 are protected by windows 110 during singulation of image sensor substrate 602. More particularly, windows 110 protect active areas 104 from contamination and scratching during singulation, e.g., from silicon shards. As a result, damage or destruction of image sensors 102 is avoided. Accordingly, yield is increased and package cost is reduced compared to the prior art.

Further, windows 110 protect active areas 104 during subsequent processing of package 100, e.g., during subsequent wire bonding and/or encapsulation and/or molding. More particularly, windows 110 protect active areas 104 from dust and contamination. Accordingly, after attachment of windows 110 to image sensors 102, structure 600 and, after singulation of image sensor substrate 602, packages 100 can be stored or further packaged in any facility with or without a cleanroom.

Recall that in the prior art, the housing, which hermetically sealed the image sensor, was mounted directly to the printed circuit mother board. Thus, to avoid damage or destruction of the image sensor, the image sensor had to be carefully stored and packaged in a cleanroom. Since the prior art requirement carefully storing and packaging the image sensor in a cleanroom is eliminated, the cost associated with package 100 is reduced compared to the prior art.

Further, by forming a plurality of packages 100 simultaneously, several advantages are realized. One advantage is that it is less labor intensive to handle and process a plurality of packages 100 simultaneously rather than to handle and process each package 100 on an individual basis. Another advantage is that usage of materials is more efficient when an array of packages 100 is fabricated. By reducing labor and using less material, the cost associated with each package 100 is minimized. However, in light of this disclosure, those of skill in the art will recognize that packages 100 can also be manufactured on an individual basis, if desired. For example, referring to FIGS. 1 and 2, window 110 is attached by window support 108 after image sensor 102 is die attached and/or wire bonded.

Referring again to FIG. 9, window support layer 650 is selectively removed to expose bond pads 106. However, in certain applications, it may be desirable to avoid formation of window support layer 650 above bond pads 106 in the first place, thus avoiding the necessity of later having to selectively remove window support layer 650. As discussed in greater detail below with reference to FIG. 110A, in one embodiment, instead of forming window support layer 650 to entirely cover upper surface 602U of image sensor substrate 602 as shown in FIG. 6, window supports are selectively formed on active areas 104.

Figure 10A:
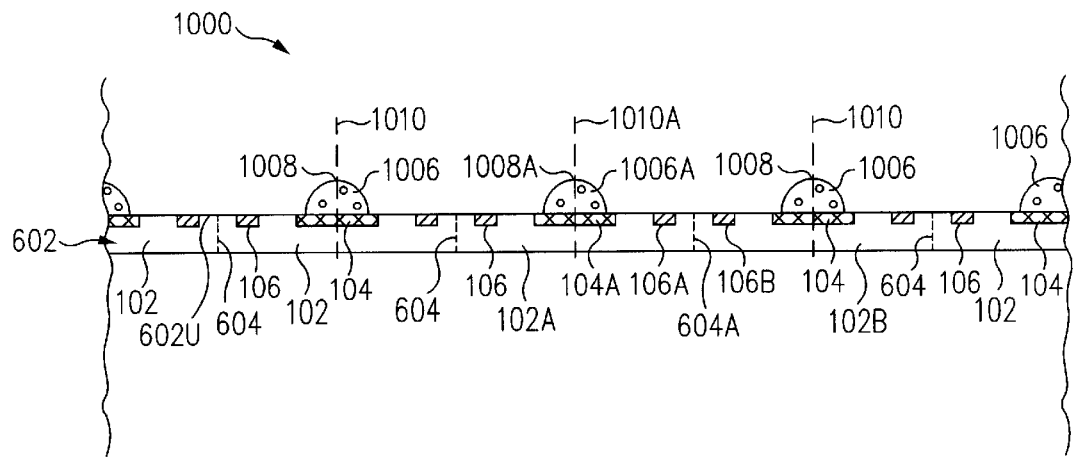
FIGS. 10A and 10B are cross-sectional views of a structure during the fabrication of a plurality of image sensor packages in accordance with alternative embodiments of the present invention.

FIG. 10A is a cross-sectional view of a structure 1000 during the fabrication of a plurality of packages 100A (FIG. 3) in accordance with an alternative embodiment of the present invention. Structure 1000 of FIG. 10A is similar to structure 600 of FIG. 6 and only the significant differences are discussed below.

As shown in FIG. 10A, drops 1006 are applied to each active area 104 such that drops 1006 are on active areas 104. To illustrate, a first drop 1006A of the plurality of drops 1006 is applied to, and is on, active area 104A. In one embodiment, drop 1006A is applied by pin transfer of a bonding material. More particularly, a pin is dipped in a bath of the bonding material, the pin is removed from the bath such that the tip of the pin is coated with the bonding material, and the tip of the pin is moved adjacent to active area 104A. The bonding material is transferred from the tip of the pin to active area 104A to form drop 1006A. However, in light of this disclosure, those of skill in the art will recognize that other techniques can be used to apply drop 1006A to active area 104A. For example, drop 1006A is formed using a syringe and/or screen printing technique. The other drops 1006 are formed in a similar manner simultaneously or, alternatively, one at a time.

Of importance, drop 1006A has an apex 1008A near, or at, a horizontal center 1010A of drop 1006A. The other drops 1006 have corresponding apexes 1008 near corresponding horizontal centers 1010 in a similar manner.

Figure 10B:
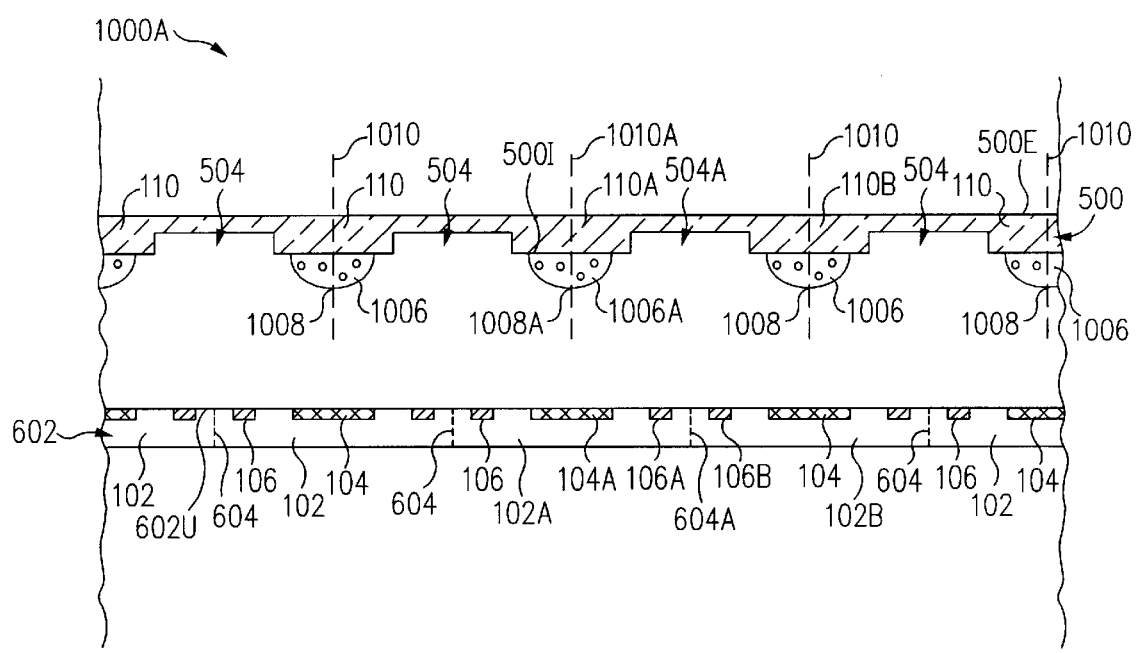
Figure 11:
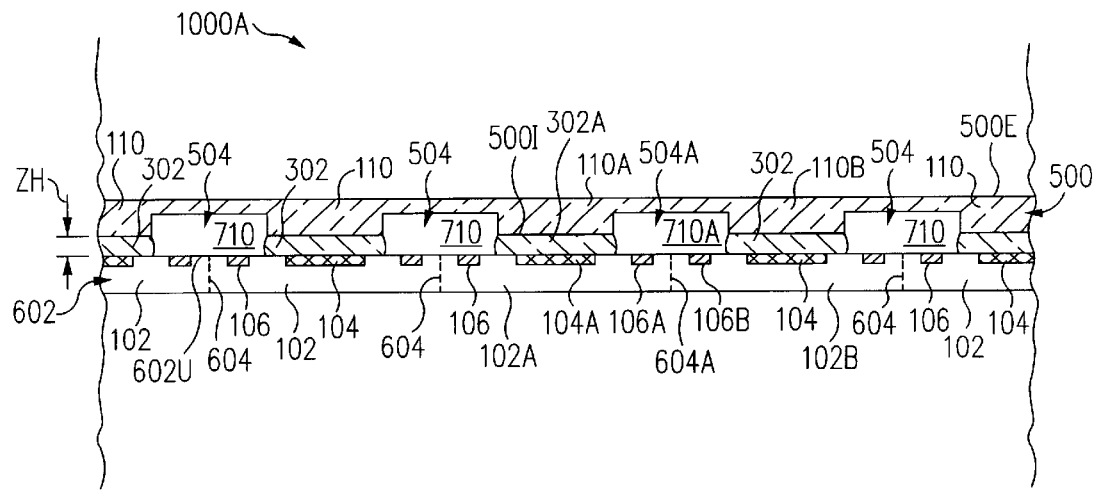
FIG. 11 is a cross-sectional view of the structure of FIG. 10A or FIG. 10B at a further stage of fabrication.

FIG. 11 is a cross-sectional view of structure 1000 of FIG. 10A (or FIG. 10B) at a further stage of fabrication in accordance with the present invention. Referring now to FIGS. 10A and 11 together, interior surface 500I of window sheet 500 is pressed into drops 1006 to form window supports 302. More particularly, windows 110 of window sheet 500 are pressed into corresponding drops 1006 to form corresponding window supports 302.

To illustrate, window 110A of window sheet 500 is pressed into drop 1006A to form window support 302A. Of importance, since drop 1006A is formed to have an apex 1008A, window 110A initially contacts apex 1008A. As window 110A is pressed into drop 1006A, drop 1006A is squeezed by window 110A downwards, e.g., in a first direction, towards active area 104A and outwards from apex 1008A. Squeezing drop 1006A in this manner avoids bubble formation, i.e., avoids entrapment of air under window 110A and within window support 302A. These bubbles would otherwise distort radiation passing through window support 302A.

Further, drop 1006A has a volume sufficient to have window support 302A entirely cover active area 104A of image sensor 102A after window sheet 500 is pressed into place. However drop 1006A has a volume insufficient to have window support 302A extend over any of bond pads 106. In one embodiment, drop 1006A is formed within active area 104A and is squeezed such that window support 302A entirely covers active area 104A after window sheet 500 is pressed into place.

Although the placement of window 110A into drop 1006A is described above, it is understood that the other windows 110 are placed into the other corresponding drops 1006 to form the other corresponding window supports 302 in a similar manner simultaneously.

In alternative embodiment, instead of applying drops 1006 to active areas 104 as illustrated in FIG. 10A, drops 1006 are applied to window sheet 500. Generally, drops 1006 are applied to corresponding active areas 104 or, alternatively, to corresponding windows 110, and are squeezed between active areas 104 and corresponding windows 110 to form corresponding window supports 302.

FIG. 10B is a cross-sectional view of a structure 1000A in accordance with this alternative embodiment of the present invention. Referring now to FIG. 10B, drops 1006 are applied to each window 110 of window sheet 500 such that drops 1006 are on windows 110. To illustrate, a first drop 1006A of the plurality of drops 1006 is applied to, and is on, window 110A. Drop 1006A is applied to window sheet 500 in a similar manner to that described above in reference to the application of drop 1006A to active area 104A to FIG. 10A. The other drops 1006 are formed in a similar manner simultaneously or, alternatively, one at a time.

Of importance, drop 1006A has an apex 1008A near, or at, a horizontal center 1010A of drop 1006A. The other drops 1006 have corresponding apexes 1008 near corresponding horizontal centers 1010 in a similar manner.

Drops 1006 are pressed into corresponding active areas 104 to form corresponding window supports 302. For example, window sheet 500 is moved towards image sensor substrate 602 to press drops 1006 into corresponding active areas 104. To illustrate, referring now to FIGS. 10B and 11 together, drop 1006A is pressed into active area 104A to form window support 302A. Of importance, since drop 1006A is formed to have an apex 1008A, active area 104A initially contacts apex 1008A. As drop 1006A is pressed into active area 104A, drop 1006A in squeezed by active area 104A upwards, e.g., in a second direction, towards window 110A and outwards from apex 1008A. Squeezing drop 1006A in this manner avoids bubble formation, i.e., avoids entrapment of air above active area 104A and within window support 302A.

Further, drop 1006A has a volume sufficient to have window support 302A entirely cover active area 104A of image sensor 102A after window sheet 500 is pressed into place. However drop 1006A has a volume insufficient to have window support 302A extend over any of bond pads 106.

Although pressing of drop 1006A into active area 104A is described above, it is understood that the other drops 1006 are pressed into the other corresponding active areas 104 to form the other corresponding window supports 302 in a similar manner simultaneously.

Regardless of whether structure 1000 of FIG. 11 was formed using the method described above in reference to FIG. 10A or FIG. 10B, referring now to FIG. 11, window supports 302 are setup. Window sheet 500 is cut to singulated windows 110 in a manner similar to that illustrated and described above in reference to FIG. 8A or FIG. 8B, with the exception being that cavities 710 are now formed by shallow cuts 504, window supports 302 and upper surface 602U of image sensor substrate 602. Image sensor substrate 602 is singulated along singulation streets 604 to form a plurality of packages 100A (FIG. 3).

Advantageously, by pressing window sheet 500 into window support layer 650 (FIG. 7) or into drops 1006 (FIG. 11) in the above manner, windows 110 are essentially parallel to upper surfaces 102U of image sensors 102. Further, a distance ZH, sometimes called the Z height, between windows 110 and image sensors 102 is precisely controlled to within tight tolerance.

In the prior art, the window was placed on a shelf of the housing after the housing was fabricated. Since a significant tolerance was associated with the window placement, the distance between the window and the image sensor had significant variations from assembly to assembly. However, to insure optimum operation of the image sensor, it is important that the distance between the window and the image sensor be precise. Since the tolerance in this distance is reduced in packages 100 and 100A (FIGS. 2 and 3, respectively), the performance of packages 100 and 100A is superior to that of the prior art.

Although pressing of window sheet 500 into window support layer 650 (FIG. 7) or into drops 1006 (FIG. 11) is described above, in an alternative embodiment, window sheet 500 is singulated to form a plurality of individual windows 110, which are individually pressed into window support layer 650 (FIG. 7) or into drops 1006 (FIG. 11) sequentially or, alternatively, simultaneously.

In one embodiment, after singulation of image sensor substrate 602, package 100 (FIG. 2) is further packaged. Advantageously, since active area 104 of image sensor 102 is protected by window 110, package 100 can be further packaged using any one of a number of conventional packaging techniques, e.g., standard molding and/or liquid encapsulation techniques. For example, package 100 is put into a flip chip image sensor assembly such as that illustrated in FIG. 12, a leadframe image sensor assembly such as that illustrated in FIG. 13 or a wirebonded image sensor assembly such as that illustrated in FIG. 14.

FIG. 12 is a cross-sectional view of a flip chip image sensor assembly 1200 (hereinafter assembly 1200) in accordance with one embodiment of the present invention. Referring to FIG. 12, assembly 1200 includes a substrate 1202. To illustrate, substrate 1202 is a printed circuit board or, alternatively, is tape, as those of skill in the art will understand.

Substrate 1202 includes a plurality of electrically conductive traces 1204 formed on a lower, e.g., first, surface 1202L of substrate 1202. Bond pads 106 are electrically connected to corresponding traces 1204 by corresponding electrically conductive bumps 1206. Traces 1204 are electrically connected to corresponding electrically conductive vias 1208 which extend from lower surface 1202L to an upper, e.g., second, surface 1202U of substrate 1202 opposite lower surface 1202L. Vias 1208 are electrically connected to corresponding electrically conductive traces 1210 on upper surface 1202U of substrate 1202. Formed on traces 1210 are corresponding electrically conductive pads 1212. Formed on pads 1212 are corresponding electrically conductive interconnection balls 1214 such as solder balls. Interconnection balls 1214 are used to electrically connect assembly 1200 to a larger substrate (not shown) such as a printed circuit mother board.

To illustrate, a first bond pad 106A of the plurality of bond pads 106 is electrically connected to a first trace 1204A of the plurality of traces 1204 by a first bump 1206A of the plurality of bumps 1206. Trace 1204A is electrically connected to a first via 1208A of the plurality of vias 1208. Via 1208A is electrically connected to a first trace 1210A of the plurality of traces 1210. A first pad 1212A of the plurality of pads 1212 is formed on trace 1210A. Formed on pad 1212A is a first interconnection ball 1214A of the plurality of interconnection balls 1214.

As set forth above, an electrically conductive pathway between bond pad 106A and interconnection ball 1214A is formed by bump 1206A, trace 1204A, via 1208A, trace 1210A and pad 1212A. The other bond pads 106, bumps 1206, traces 1204, vias 1208, traces 1210, pads 1212 and interconnection balls 1214 are electrically connected to one another in a similar fashion so are not discussed further to avoid detracting from the principals of the invention.

Although a particular electrically conductive pathway between interconnection ball 1214A and bond pad 106A is described above, in light of this disclosure, it is understood that other electrically conductive pathways can be formed. For example, substrate 1202 is a multi-layered laminated substrate and, instead of straight-through vias 1208, a plurality of electrically conductive traces on various layers in substrate 1202 are interconnected by a plurality of electrically conductive vias to form the electrical interconnections between traces 1204 and 1210.

As a further example, vias 1208 extend along sides 1202S of substrate 1202 and traces 1204 and 1210 extend to sides 1202S. As another alternative, interconnection balls 1214 are distributed in an array format to form a ball grid array (BGA) package. Alternatively, interconnection balls 1214 are not formed, e.g., to form a metal land grid array (LGA) package or a leadless chip carrier (LCC) package. Other electrically conductive pathway modifications will be obvious to those of skill in the art.

Substrate 1202 includes a central aperture 1216. Window 110 is located within, or is located adjacent to, central aperture 1216. In particular, exterior surface 110E of window 110 is exposed through aperture 1216. During use, radiation is directed at assembly 1200. This radiation passes through window 110, through window support 108, and strikes active area 104. Active area 104 responds to this radiation as is well known to those of skill in the art.

Assembly 1200 further includes a package body 1218. Package body 1218 is an electrically insulating material and electrically protects, e.g., prevents shorting of, and environmentally protects, e.g., from moisture, the various electrically conductive structures of assembly 1200. In addition, package body 1218 provides mechanical strength to assembly 1200 and, in particular, minimizes failure of bumps 1206 and the associated detachment of image sensor 102 from substrate 1202.

In this embodiment, package body 1218 encloses sides 102S of image sensor 102, lower surface 1202L and central aperture 1216 of substrate 1202, traces 1204, and window support 108. Further, package body 1218, in combination with window support 108, mechanically locks window 110 in place. In particular, package body 1218 includes an exterior locking feature 1220, which fills pocket 408 of window 110, thus mechanically locking window 110 in place. In one embodiment, package body 1218 including exterior locking feature 1220 is integral, i.e., is one piece and not a plurality of single pieces connected together. In this embodiment, package body 1218 leaves exposed exterior surface 110E of window 110, i.e., package body 1218 does not contact or cover exterior surface 110E.

Package body 1218 is formed of any one of a number of conventional packaging materials. For example, package body 1218 is formed from a plastic encapsulant or, alternatively, a liquid encapsulant.

FIG. 13 is a cross-sectional view of a leadframe image sensor assembly 1300 (hereinafter assembly 1300) in accordance with an alternative embodiment of the present invention. Referring now to FIG. 13, a lower, e.g., second, surface 102L of image sensor 102 is attached to a die attach pad 1302 of a leadframe 1304. For example, lower surface 102L is attached to die attach pad 1302 with adhesive 1306.

Leadframe 1304 further includes a plurality of leads 1308. Bond pads 106 are electrically connected to corresponding leads 1308 by corresponding bond wires 1310. For example, a first bond pad 106A of the plurality of bond pads 106 is electrically connected to a first lead 1308A of the plurality of leads 1308 by a first bond wires 1310A of the plurality of bond wires 1310. The other bond pads 106 are electrically connected to the other corresponding leads 1308 by the other corresponding bond wires 1310 in a similar fashion so are not discussed further.

Assembly 1300 further includes a package body 1312. Package body 1312 is an electrically insulating material and electrically protects, e.g., prevents shorting of, and environmentally protects, e.g., from moisture, the various electrically conductive structures of assembly 1300.

Package body 1312 encloses sides 102S of image sensor 102, bond wires 1310, die attach pad 1302, inner ends 1308I of leads 1308, and window support 108. Further, package body 1312, in combination with window support 108, mechanically locks window 110 in place. In particular, package body 1312 includes an exterior locking feature 1314 which fills pocket 408 of window 110, thus mechanically locking window 110 in place. In one embodiment, package body 1312 including exterior locking feature 1314 is integral. In this embodiment, package body 1312 leaves exposed exterior surface 110E of window 110, i.e., package body 1312 does not contact or cover exterior surface 110E.

Package body 1312 is formed of any one of a number of conventional packaging materials. For example, package body 1312 is formed from a plastic encapsulant or, alternatively, a liquid encapsulant.

Figure 14:
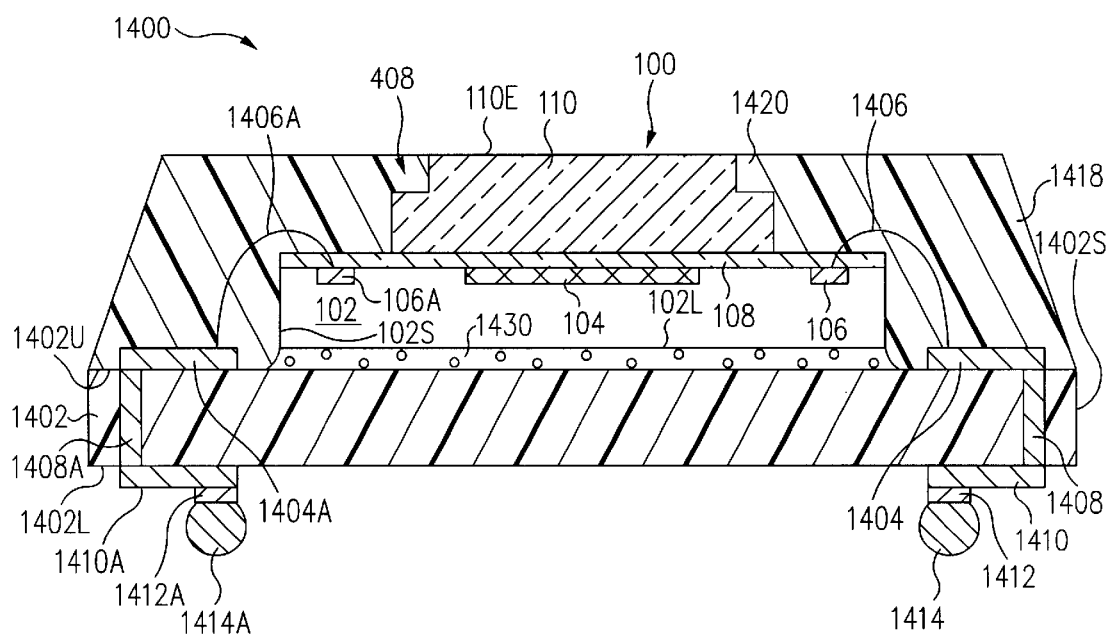
FIG. 14 is a cross-sectional view of a wirebonded image sensor assembly in accordance with yet another alternative embodiment of the present invention.

FIG. 14 is a cross-sectional view of a wirebonded image sensor assembly 1400 (hereinafter assembly 1400) in accordance with yet another alternative embodiment of the present invention. Referring to FIG. 14, assembly 1400 includes a substrate 1402. To illustrate, substrate 1402 is a printed circuit board, ceramic, or tape, although other materials are used in other embodiments. Lower surface 102L of image sensor 102 is attached to an upper, e.g., first, surface 1402U of substrate 1402, for example, with adhesive 1430.

Substrate 1402 includes a plurality of electrically conductive traces 1404 formed on upper surface 1402U of substrate 1402. Bond pads 106 are electrically connected to corresponding traces 1404 by corresponding electrically conductive bond wires 1406. Traces 1404 are electrically connected to corresponding electrically conductive vias 1408 which extend from upper surface 1402U to a lower, e.g., second, surface 1402L of substrate 1402 opposite upper surface 1402U. Vias 1408 are electrically connected to corresponding electrically conductive traces 1410 on lower surface 1402L of substrate 1402. Formed on traces 1410 are corresponding electrically conductive pads 1412. Formed on pads 1412 are corresponding electrically conductive interconnection balls 1414 such as solder balls. Interconnection balls 1414 are used to electrically connect assembly 1400 to a larger substrate (not shown) such as a printed circuit mother board.

To illustrate, a first bond pad 106A of the plurality of bond pads 106 is electrically connected to a first trace 1404A of the plurality of traces 1404 by a first bond wire 1406A of the plurality of bond wires 1406. Trace 1404A is electrically connected to a first via 1408A of the plurality of vias 1408. Via 1408A is electrically connected to a first trace 1410A of the plurality of traces 1410. A first pad 1412A of the plurality of pads 1412 is formed on trace 1410A. Formed on pad 1412A is a first interconnection ball 1414A of the plurality of interconnection balls 1414.

As set forth above, an electrically conductive pathway between bond pad 106A and interconnection ball 1414A is formed by bond wire 1406A, trace 1404A, via 1408A, trace 1410A and pad 1412A. The other bond pads 106, bond wires 1406, traces 1404, vias 1408, traces 1410, pads 1412 and interconnection balls 1414 are electrically connected to one another in a similar fashion so are not discussed further to avoid detracting from the principals of the invention.

Although a particular electrically conductive pathway between interconnection ball 1414A and bond pad 106A is described above, in light of this disclosure, it is understood that other electrically conductive pathways can be formed. For example, substrate 1402 is a multi-layered laminated substrate and, instead of straight-through vias 1408, a plurality of electrically conductive traces on various layers in substrate 1402 are interconnected by a plurality of electrically conductive vias to form the electrical interconnections between traces 1404 and 1410.

As a further example, vias 1408 extend along sides 1402S of substrate 1402 and traces 1404 and 1410 extend to sides 1402S. As another alternative, interconnection balls 1414 are distributed in an array format to form a ball grid array (BGA) package. Alternatively, interconnection balls 1414 are not formed, e.g., to form a metal land grid array (LGA) package or a leadless chip carrier (LCC) package. Other electrically conductive pathway modifications will be obvious to those of skill in the art.

Assembly 1400 further includes a package body 1418. Package body 1418 is an electrically insulating material and electrically protects, e.g., prevents shorting of, and environmentally protects, e.g., from moisture, the various electrically conductive structures of assembly 1400.

In this embodiment, package body 1418 encloses sides 102S of image sensor 102, upper surface 1402U of substrate 1402, traces 1404, bond wires 1406 and window support 108. Further, package body 1418, in combination with window support 108, mechanically locks window 110 in place. In particular, package body 1418 includes an exterior locking feature 1420 which fills pocket 408 of window 110, thus mechanically locking window 110 in place. In one embodiment, package body 1418 including exterior locking feature 1420 is integral. In this embodiment, package body 1418 leaves exposed exterior surface 110E of window 110, i.e., package body 1418 does not contact or cover exterior surface 110E.

Package body 1418 is formed of any one of a number of conventional packaging materials. For example, package body 1418 is formed from a plastic encapsulant or, alternatively, a liquid encapsulant.

FIGS. 12, 13 and 14 are examples of image sensor assemblies, which incorporate package 100 in accordance with present invention. In light of this disclosure, those of skill in the art will understand that other image sensor assemblies, which incorporate package 100, can be fabricated. For example, referring to FIGS. 13, 14, bond wires 1310, 1406, respectively, break through window support 108 to bond pads 106 from heat and mechanical energy during the wire bonding process. However, to avoid having to break through window support 108, package 100A (FIG. 3) having exposed bond pads 106 is used in place of package 100. As a further example, solder masks can be applied to upper surface 1202U and/or lower surface 1202L of substrate 1202

(FIG. 12) and/or upper surface 1402U and/or lower surface 1402L of substrate 1402 (FIG. 14).

This application is related to: Webster et al., commonly assigned U.S. patent application Ser. No. 09/490,717, filed Jan. 25, 2000, entitled "PROTECTED IMAGE SENSOR PACKAGE"; Webster et al., commonly assigned U.S. patent application Ser. No. 09/491,112, filed Jan. 25, 2000, entitled "PROTECTED IMAGE SENSOR PACKAGE FABRICATION METHOD"; and Glenn et al., commonly assigned and co-filed U.S. patent application Ser. No. 09/610,309, entitled "WAFER SCALE IMAGE SENSOR PACKAGE FABRICATION METHOD", which are all herein incorporated by reference in their entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A structure comprising:
   an image sensor having a bond pad and an active area, said bond pad and said active area being on a first surface of said image sensor;
   a window support on said first surface, said window support entirely enclosing said first surface including said active area and said bond pad; and
   a window in contact with said window support, said window overlying said active area.

2. The structure of claim 1 wherein said active area is a receiver, transmitter, or transceiver of radiation, said window support being transparent to said radiation.

3. The structure of claim 2 wherein said window is transparent to said radiation.

4. The structure of claim 1 wherein said window support is an epoxy, which has been setup.

5. The structure of claim 1 wherein sides of said image sensor are coplanar with sides of said window support.

6. The structure of claim 1 wherein said window is parallel to said first surface of said image sensor.

7. The structure of claim 1 wherein a first surface of said window is secured to said window support and a second surface of said window is exposed to an ambient environment.

8. The structure of claim 1 wherein a refractive index of said window support is similar to a refractive index of said window.

9. The structure of claim 1 wherein said window support completely fills a region between said window and said active area.

10. The structure of claim 9 wherein said structure is an image sensor package, said image sensor package being a cavityless package.

11. The structure of claim 1 wherein said window comprises a side having a locking feature.

12. The structure of claim 1 wherein said image sensor is one of plurality of image sensors integrally connected together.

13. A structure comprising:
   an image sensor substrate comprising a plurality of image sensors integrally connected together, said plurality of image sensors comprising a first image sensor having a first bond pad and an active area;
   a window support layer on a first surface of said image sensor substrate, said window support layer covering said first bond pad and said active area; and
   a first window in contact with said window support layer, said window support layer supporting said first window above said active area.

14. The structure of claim 13 wherein said plurality of image sensors comprises a second image sensor, a singulation street delineating said first image sensor from said second image sensor.

15. The structure of claim 14 wherein said second image sensor comprises a second bond pad, said first bond pad and said second bond pad being formed directly adjacent to said singulation street and opposite from one another relative to said singulation street.

16. The structure of claim 15 further comprising a window sheet comprising said first window and a second window, a cut in said window sheet delineating said first window from said second window.

17. The structure of claim 16 wherein said cut and said window support layer define a cavity above said singulation street, said first bond pad, and said second bond pad.

18. The structure of claim 16 wherein a first surface of said window sheet is in contact with said window support layer, said cut being in said first surface of said window sheet.

* * * * *